United States Patent
Choi et al.

(10) Patent No.: US 10,832,983 B2
(45) Date of Patent: Nov. 10, 2020

(54) SEMICONDUCTOR DEVICE HAVING A TRENCH TYPE DEVICE ISOLATION FILM AND METHOD FOR FABRICATING THE SAME

(71) Applicant: SAMSUNG ELECTRONICS CO., LTD., Suwon-si (KR)

(72) Inventors: Ji Min Choi, Hwaseong-si (KR); Dong Ryul Lee, Suwon-si (KR); Ho Ouk Lee, Seoul (KR); Ji Young Kim, Yongin-si (KR); Chang Hyun Cho, Yongin-si (KR)

(73) Assignee: SAMSUNG ELECTRONICS CO., LTD., Suwon (KR)

( * ) Notice: Subject to any disclaimer, the term of this patent is extended or adjusted under 35 U.S.C. 154(b) by 113 days.

(21) Appl. No.: 15/673,248

(22) Filed: Aug. 9, 2017

(65) Prior Publication Data
US 2018/0166352 A1 Jun. 14, 2018

(30) Foreign Application Priority Data
Dec. 13, 2016 (KR) .................. 10-2016-0169936

(51) Int. Cl.
*H01L 21/762* (2006.01)
*H01L 23/14* (2006.01)
*H01L 27/108* (2006.01)

(52) U.S. Cl.
CPC ...... *H01L 23/147* (2013.01); *H01L 21/76205* (2013.01); *H01L 21/76227* (2013.01); *H01L 21/76229* (2013.01); *H01L 27/10894* (2013.01)

(58) Field of Classification Search
CPC ......... H01L 21/76224; H01L 21/76877; H01L 27/11573; H01L 21/76283; H01L 21/76229; H01L 21/762
USPC ................................ 257/510; 438/435, 427
See application file for complete search history.

(56) References Cited

U.S. PATENT DOCUMENTS

| 4,701,777 | A | * | 10/1987 | Takayama | ............... H01L 21/82 257/206 |
| 6,194,283 | B1 | | 2/2001 | Gardner et al. | |
| 6,255,194 | B1 | * | 7/2001 | Hong | ................ H01L 21/76224 257/E21.546 |
| 6,596,607 | B2 | | 7/2003 | Ahn | |
| 6,881,646 | B2 | * | 4/2005 | Ishitsuka | ........... H01L 21/76232 438/424 |
| 7,163,869 | B2 | | 1/2007 | Kim et al. | |
| 7,439,155 | B2 | | 10/2008 | Mouli et al. | |
| 7,589,391 | B2 | | 9/2009 | Ohta et al. | |
| 7,632,737 | B2 | * | 12/2009 | Rueger | ............. H01L 21/76235 257/E21.546 |
| 7,968,422 | B2 | | 6/2011 | Hautala | |

(Continued)

FOREIGN PATENT DOCUMENTS

| JP | 2003-273206 | 9/2003 |
| KR | 101025731 | 3/2011 |

*Primary Examiner* — Mark V Prenty
(74) *Attorney, Agent, or Firm* — F. Chau & Associates, LLC

(57) ABSTRACT

A semiconductor device includes a substrate having a semiconductor layer. A trench is formed within the semiconductor layer. A filling insulating film is disposed within the trench. An insertion liner is disposed within the filling insulating film. The insertion liner is spaced apart from the semiconductor layer and extends along the bottom surface of the trench.

16 Claims, 18 Drawing Sheets

(56) References Cited

U.S. PATENT DOCUMENTS

| | | |
|---|---|---|
| 8,575,716 B2 | 11/2013 | Mathew et al. |
| 8,766,362 B2 | 7/2014 | Loiko et al. |
| 9,331,144 B2 | 5/2016 | Ujihara et al. |
| 2002/0048897 A1 | 4/2002 | Hong |
| 2003/0199151 A1* | 10/2003 | Ho .................... H01L 21/31111 438/437 |
| 2006/0270183 A1* | 11/2006 | Kim .................. H01L 21/76229 438/424 |
| 2008/0006866 A1 | 1/2008 | Lee |
| 2009/0020845 A1 | 1/2009 | Shin et al. |
| 2009/0189246 A1* | 7/2009 | Wu .................. H01L 21/76224 257/510 |

* cited by examiner

SEMICONDUCTOR DEVICE HAVING A TRENCH TYPE DEVICE ISOLATION FILM AND METHOD FOR FABRICATING THE SAME

CROSS-REFERENCE TO RELATED APPLICATION

This application claims priority under 35 U.S.C. § 119, to Korean Patent Application No. 10-2016-0169936, filed on Dec. 13, 2016 in the Korean Intellectual Property Office, the contents of which are herein incorporated by reference in its entirety.

TECHNICAL FIELD

The present disclosure relates to a semiconductor device, and more particularly, to a semiconductor device comprising a trench type device isolation film and a fabricating method thereof.

DISCUSSION OF THE RELATED ART

A device isolation film is formed in a semiconductor device to divide an active region thereof. A local oxidation of silicon (LOCOS) oxide film may be used as the device isolation film for the semiconductor device. However, the LOCOS oxide film may have a beak-like portion (e.g., a bird's beak-like portion) on an edge thereof, thus reducing an area of the active region while also generating leakage current. To solve this problem, a shallow trench isolation (STI) structure having a narrow width and excellent device isolation features may be used.

Dynamic random-access memory (DRAM) is a common semiconductor device. Modern DRAM devices may have a high level of integration as more and more memory cells are fit into a smaller die. As the DRAM devices are more highly integrated, the cell to cell spacing gradually decreases, and accordingly, gap-fill margins for device isolation also gradually decreases. The widths of the active region should increase in order to increase the cell currents in a cell transistor, but this may cause decreased critical dimension (CD) of the device isolation film.

SUMMARY

A semiconductor device includes a substrate having a semiconductor layer. A trench is formed within the semiconductor layer. A filling insulating film is disposed within the trench. An insertion liner is disposed within the filling insulating film. The insertion liner is spaced apart from the semiconductor layer and extends along the bottom surface of the trench.

A semiconductor device includes a substrate. A trench is formed within the substrate. The trench includes a first sidewall and a second sidewall opposite to each other. A first insulating film extends along the first sidewall, the second sidewall, and a bottom surface of the trench. A second insulating film is disposed on the first insulating film. The second insulating film extends along the bottom surface of the trench and the first sidewall of the trench. A thickness of the second insulating film on the bottom surface of the trench is greater than a thickness of the second insulating film on the first sidewall of the trench. A third insulating film is disposed on the second insulating film. The third insulating film fills the trench.

A semiconductor device includes a substrate. A first trench is formed within the substrate. The first trench has a first width. A second trench is formed within the substrate. The second trench has a second width different from the first width. A first device isolation film includes a first insulating film extending along a sidewall and a bottom surface of the first trench. A second insulating film is disposed on the first insulating film and extends along the bottom surface of the first trench. A third insulating film is disposed on the second insulating film and fills the first trench. The second insulating film includes a material having an etch electivity with respect to the first insulating film and the third insulating film. A second device isolation film fills the second trench and includes a material having an etch selectivity with respect to the second insulating film.

A method for fabricating a semiconductor device includes forming a trench within a substrate. An oxide film is formed along a sidewall of the trench, a bottom surface of the trench, and along an upper surface of the substrate. A nitride film is formed on the oxide film, along the bottom surface of the trench and the upper surface of the substrate. The nitride film is not formed on the sidewall of the trench. The trench is filled with a gap fill insulating film, the gap fill insulating film covering the nitride film. The nitride film is exposed by planarizing the gap fill insulating film. The oxide film is exposed on the upper surface of the substrate by removing the exposed nitride film.

A method for fabricating a semiconductor device includes forming a trench within a substrate. An oxide film is formed along a sidewall and a bottom surface of the trench and along an upper surface of the substrate. A nitride film is formed on the oxide film, along the sidewall and the bottom surface of the trench, and along the upper surface of the substrate. A thickness of the nitride film on the upper surface of the substrate and a thickness of the nitride film on the bottom surface of the trench are each greater than a thickness of the nitride film on the sidewall of the trench. The trench is filled with a gap fill insulating film. The gap fill insulating film covers the nitride film. The nitride film is exposed by planarizing the gap fill insulating film. The oxide film is exposed on the upper surface of the substrate by removing the exposed nitride film.

A method for fabricating a semiconductor device includes forming a first trench within a substrate, the first trench having a first width and a second trench having a second width. The second trench is filled with an oxide film along a sidewall and a bottom surface of the first trench and an upper surface of the substrate. A nitride film is formed on the oxide film, along the sidewall and the bottom surface of the first trench and the upper surface of the substrate. A thickness of the nitride film on the upper surface of the substrate and a thickness of the nitride film on the bottom surface of the first trench are greater than a thickness of the nitride film on the sidewall of the first trench. The first trench is filled with a gap fill insulating film. The gap fill insulating film covers the nitride film. The nitride film is exposed by planarizing the gap fill insulating film. The oxide film on the upper surface of the substrate is exposed by removing the exposed nitride film.

BRIEF DESCRIPTION OF THE DRAWINGS

A more complete appreciation of the present disclosure and many of the attendant aspects thereof will become more apparent to those of ordinary skill in the art by reference to the following detailed description when considered in connection with the accompanying drawings, wherein.

DETAILED DESCRIPTION

Figure 1:
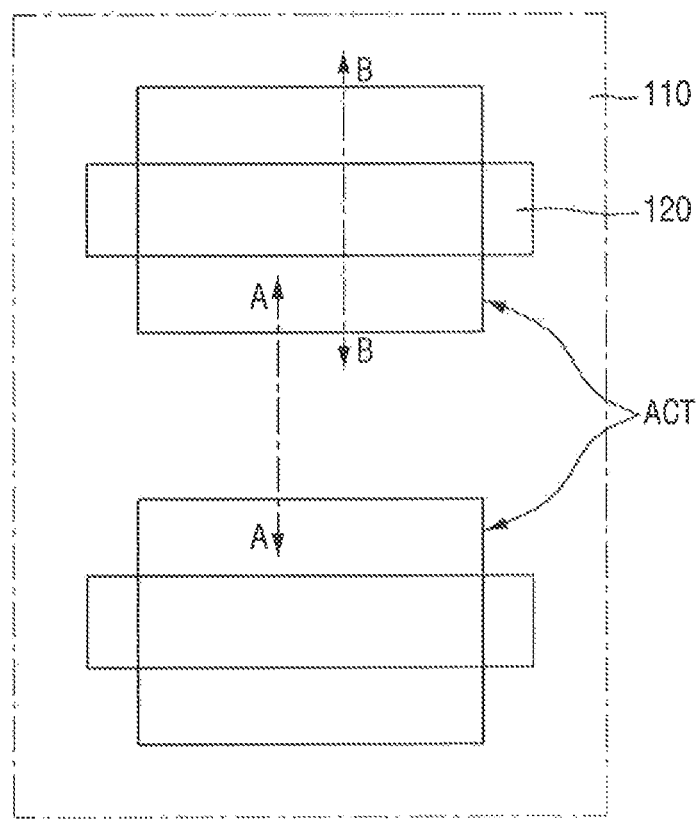
FIG. 1 is a schematic top view illustrating a semiconductor device according to some exemplary embodiments of the present invention.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

Although the drawings illustrate semiconductor devices, according to some exemplary embodiments of the present invention, as including planar transistors, exemplary embodiments of the present invention are not limited hereto. The semiconductor device, according to some exemplary embodiments of the present invention, may include a fin-type transistor (FinFET), a tunneling transistor (tunneling FET), a transistor including nanowire, a transistor including nano-sheet, and/or a three-dimensional (3D) transistor. Further, the semiconductor device, according to some exemplary embodiments of the present invention, may include a bipolar junction transistor, a laterally diffused metal oxide semiconductor (LDMOS) transistor, and so on.

Figure 2:
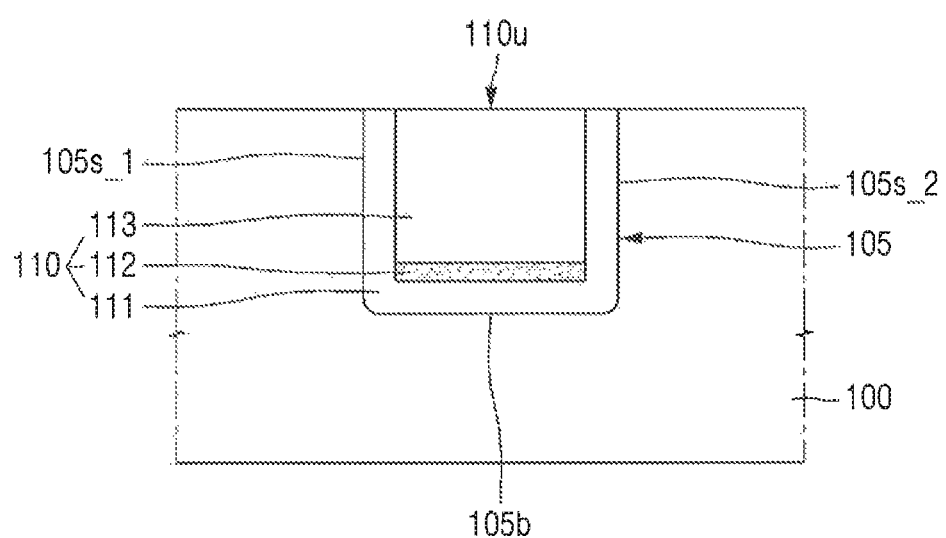
FIG. 2 is a cross sectional view taken on line A-A of FIG. 1.
Figure 3:
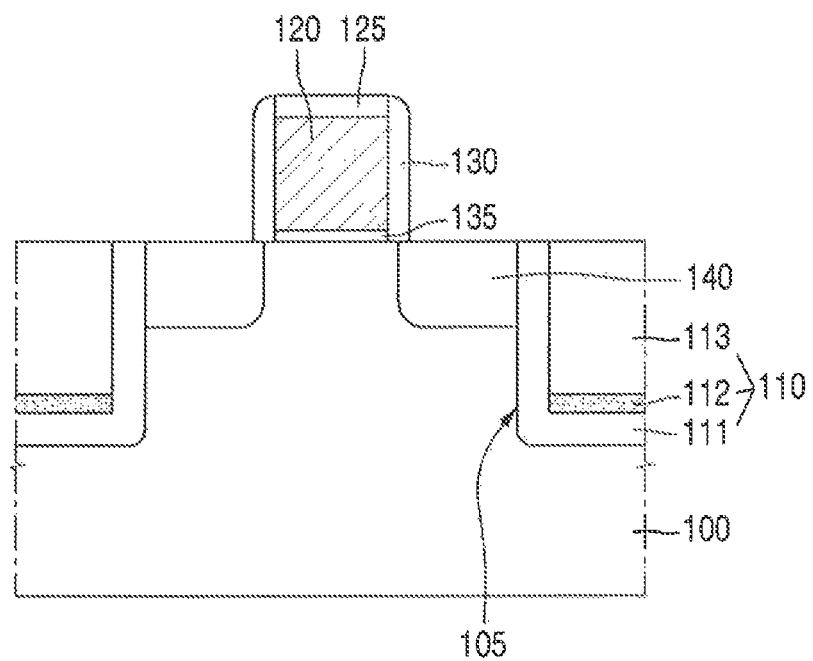
FIG. 3 is a cross sectional view taken on line B-B of FIG. 1.

FIG. 1 is a schematic top view illustrating a semiconductor device according to some exemplary embodiments of the present invention. FIG. 2 is a cross sectional view taken on line A-A of FIG. 1. FIG. 3 is a cross sectional view taken on line B-B of FIG. 1.

Referring to FIGS. 1 to 3, the semiconductor device, according to some exemplary embodiments of the present invention, may include a substrate 100, a first isolating trench 105, and a first device isolation film 110.

The substrate 100 may include a semiconductor layer. The substrate 100 may be a bulk silicon or a silicon-on-insulator (SOI).

Alternatively, the substrate 100 may be a silicon substrate, or may include other material such as silicon germanium, silicon germanium on insulator (SGOI), indium antimonide, lead telluride, indium arsenide, indium phosphide, gallium arsenide, and/or gallium antimonide, but the substrate may include other or different materials.

In the following description, it is assumed that the substrate 100 is a silicon substrate, however, the invention is not to be limited to this material.

The first isolating trench 105 may be formed within the substrate 100. For example, the first isolating trench 105 may be formed within the semiconductor layer included in the substrate 100.

The first isolating trench 105 may include a first sidewall 105s_1 and a second sidewall 105s_2 facing each other, and a bottom surface 105b connecting the first sidewall 105s_1 of the first isolating trench and the second sidewall 105s_2 of the first isolating trench.

Because the first isolating trench 105 is formed within the semiconductor layer included in the substrate 100, the first sidewall 105s_1 of the first isolating trench, the second sidewall 105s_2 of the first isolating trench, and the bottom surface 105b of the first isolating trench may be defined by the semiconductor layer.

Although FIGS. 2 and 3 illustrate a constant distance between the first sidewall 105s_1 of the first isolating trench and the second sidewall 105s_2 of the first isolating trench facing each other, this is only for convenience of explanation, and exemplary embodiments are not limited hereto.

For example, a distance between the first sidewall 105s_1 of the first isolating trench and the second sidewall 105s_2 of the first isolating trench facing each other may increase or decrease farther away from the bottom surface 105b of the first isolating trench. For example, the first device isolation film may have a substantially rectangular shape, as shown, or it may have a substantially trapezoidal shape.

The first device isolation film 110 may be formed within the substrate 100. The first device isolation film 110 may be formed by filling the first isolating trench 105. The first device isolation film 110 may include an insulating material.

The first device isolation film 110 may directly contact the semiconductor layer included in the substrate 100. The first device isolation film 110 may define an active region ACT within the substrate 100. For example, the active region ACT may be defined by the first isolating trench 105 formed within the substrate 100. The first device isolation film 110 may be formed on a periphery of the active region ACT.

FIG. 2 illustrates that an upper surface 110u of the first device isolation film is disposed flush with an upper surface of the substrate 100, but exemplary embodiments of the present invention are not limited to this particular structure.

The first device isolation film 110 may include a lower filling insulating film 111, an insertion liner 112, and an upper filling insulating film 113.

The lower filling insulating film 111 may extend along the first sidewall 105s_1 of the first isolating trench, the bottom surface 105b of the first isolating trench, and the second sidewall 105s_2 of the first isolating trench.

The lower filling insulating film 111 may contact the semiconductor layer defining the first sidewall 105s_1 of the first isolating trench, the second sidewall 105s_2 of the first isolating trench, and the bottom surface 105b of the first isolating trench.

FIG. 2 illustrates that the lower filling insulating film 111 is formed conformally on the sidewalls 105s_1, 105s_2 of the first isolating trench and the bottom surface 105b of the first isolating trench, but exemplary embodiments are not limited to this particular structure.

The insertion liner 112 may be formed on the lower filling insulating film 111. The insertion liner 112 may be formed along the bottom surface 105b of the first isolating trench.

The insertion liner 112 might not extend along the sidewalls 105s_1, 105s_2 of the first isolating trench. For example, the insertion liner 112 may include a portion extending along the bottom surface of the first isolating trench, and might not include a portion extending along the sidewalls 105s_1, 105s_2 of the first isolating trench.

Because the insertion liner 112 may be formed on the lower filling insulating film 111, the insertion liner 112 may be formed at a predetermined spacing from the semiconductor layer included in the substrate 100. The lower filling insulating film 111 may be interposed between the insertion liner 112 and the semiconductor layer.

The insertion liner 112 may be spaced apart from the bottom surface 105b of the first isolating trench and the sidewalls 105s_1, 105s_2 of the first isolating trench by a predetermined distance.

FIG. 2 illustrates that the insertion liner 112 is formed with a constant thickness along the bottom surface 105b of the first isolating trench, but this particular arrangement is shown as an example and the invention is not limited to this particular arrangement.

The upper filling insulating film 113 may be formed on both the insertion liner 112 and the lower filling insulating film 111. The upper filling insulating film 113 may fill the first isolating trench 105.

The upper filling insulating film 113 may contact the insertion liner 112 and the lower filling insulating film 111. The lower filling insulating film 111 may contact the upper filling insulating film 113 on the sidewalls 105s_1, 105s_2 of the first isolating trench.

However, because the insertion liner 112 is formed along the bottom surface 105b of the first isolating trench, the lower filling insulating film 111 does not contact the upper filling insulating film 113 on the bottom surface 105b of the first isolating trench.

Because the upper filling insulating film 113 is disposed entirely over the insertion liner 112, the insertion liner 112 is not exposed by either the upper filling insulating film 113 or the lower filling insulating film 111.

For example, the upper surface 110u of the first device isolation film includes a portion defined by the upper filling insulating film 113 and the lower filling insulating film 111 and does not include a portion defined by the insertion liner 112.

For example, the first device isolation film 110 may include the filling insulating films 111, 113 and the insertion liner 112.

The filling insulating films 111, 113 may fill the first isolating trench 105 within the substrate 100.

The insertion liner 112 may be formed within the filling insulating films 111, 113. For example, the insertion liner 112 may be formed within the filling insulating films 111, 113. The filling insulating films 111, 113 may entirely surround the insertion liner 112.

The insertion liner 112 may include a material having an etch selectivity with respect to the lower filling insulating film 111 and the upper filling insulating film 113. The insertion liner 112 may include a material having etch selectivity with respect to the filling insulating films 111, 113 entirely surrounding the insertion liner 112.

The lower filling insulating film 111 and the upper filling insulating film 113 may each include, for example, a silicon oxide-based material such as a silicon oxide. The filling insulating films 111, 113 may include, for example, silicon oxide-based materials, such as a silicon oxide. The insertion liner 112 may include a silicon nitride-based material.

For example, the lower filling insulating film 111 may include silicon oxide. The insertion liner 112 may include silicon nitride.

For example, the upper filling insulating film 113 may include silicon oxide, flowable oxide (FOX), Tonen silazene (TOSZ), undoped silica glass (USG), borosilica glass (BSG), phosphosilica glass (PSG), borophosphosilica glass (BPSG), plasma enhanced tetra ethyl ortho silicate (PE-TEOS), fluoride silicate glass (FSG), carbon doped silicon oxide (CDO), organo silicate glass (OSG), and/or SiLK, however, the instant invention is not limited to these particular materials.

In the following explanation, it is assumed that the upper filling insulating film 113 includes a silicon oxide-based material formed from TOSZ after densification. For example, the upper filling insulating film 113 may include a silicon oxide film.

A gate electrode 120 may be formed across a portion of the first device isolation film 110 and the active region ACT. It is illustrated that a gate hard mask 125 is formed on the gate electrode 120, but the instant invention is not limited to this particular configuration.

The gate electrode 120 may include, for example, polycrystalline silicon (poly Si), amorphous silicon (a-Si), silicon germanium, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), and/or vanadium (V).

The gate electrode 120 may include conductive metal oxide, conductive metal oxynitride or the like, or an oxidized form of the metallic materials from among the aforementioned materials.

Further, when the gate electrode 120 includes silicon, the gate electrode 120 may include a silicide material formed on an upper surface of the gate electrode 120.

A gate insulating film 135 may be formed between the substrate 100 and the gate electrode 120. The gate insulating film 135 may include, for example, silicon oxide, silicon oxynitride, silicon nitride, and a high-k dielectric material with a higher dielectric constant than silicon oxide.

For example, the high-k dielectric material may include hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and/or lead zinc niobate.

While the high-k dielectric material described above is explained mainly with reference to oxides, alternatively, the high-k dielectric material may include a nitride (e.g., hafnium nitride) and/or an oxynitride (e.g., hafnium oxynitride) such as those of the metallic materials (e.g., hafnium) described above.

A gate spacer 130 may be formed on a sidewall of the gate electrode 120. The gate spacer 130 may include, for example, silicon nitride (SiN), silicon oxynitride (SiON), silicon oxide (SiO2), and/or silicon oxycarbonitride (SiOCN).

FIG. 3 illustrates that the gate spacer 130 is a single-layered film, however, the gate spacer 130 may alternatively be a multi-layered film.

A source/drain region 140 may be formed on both sides of the gate electrode 120. The source/drain region 140 may be formed by doping impurity within the substrate 100. Alternatively, the source/drain region 140 may include an epitaxial pattern.

FIG. 3 illustrates an upper surface of the source/drain region 140 flush with an upper surface of the substrate 100, but other configurations may be used. For example, unlike the illustrated approach, the source/drain region 140 may be elevated above the substrate 100.

Although FIG. 1 illustrates only one gate electrode 120 formed on the active region ACT, exemplary embodiments may include any number of gate electrodes.

Because hot carriers of the transistor have high energy, the hot carriers may permeate into the device isolation film and may be easily trapped within the device isolation film. Most of the hot carriers permeated into the device isolation film may be electrons.

When a nitride film is formed on the sidewall portion of the device isolation film, electrons permeated into the device isolation film may be easily trapped on the sidewall portion of the device isolation film.

When electrons are densely gathered on the nitride film formed on the sidewall of the device isolation film, holes of the silicon substrate included in the active region may be abandoned on the sidewall of the device isolation film. When electrons are densely trapped on the nitride film of the device isolation film, the holes within the silicon substrate may also be densely gathered in a corresponding manner.

Accordingly, due to influence of the electrical field generated by the electron charges trapped on the nitride film, a threshold voltage of the transistor may change and reliability of the semiconductor device may be degraded.

However, in the semiconductor device according to some exemplary embodiments of the present invention, the insertion liner 112 including silicon nitride might not be formed on the sidewall portion of the first device isolation film 110. For example, the insertion liner 112 might not include a portion extending along the sidewall of the first isolating trench 105.

Accordingly, because the hot carriers permeated into the first device isolation film 110 are not trapped along the sidewall of the first device isolation film 110, the holes of the substrate 100 also might not gather along the sidewall of the first device isolation film 110.

Accordingly, in the semiconductor device according to some exemplary embodiments of the present invention, the occurrence of the hot electron induced punchthrough (HEIP) phenomenon can be prevented.

Figure 4:
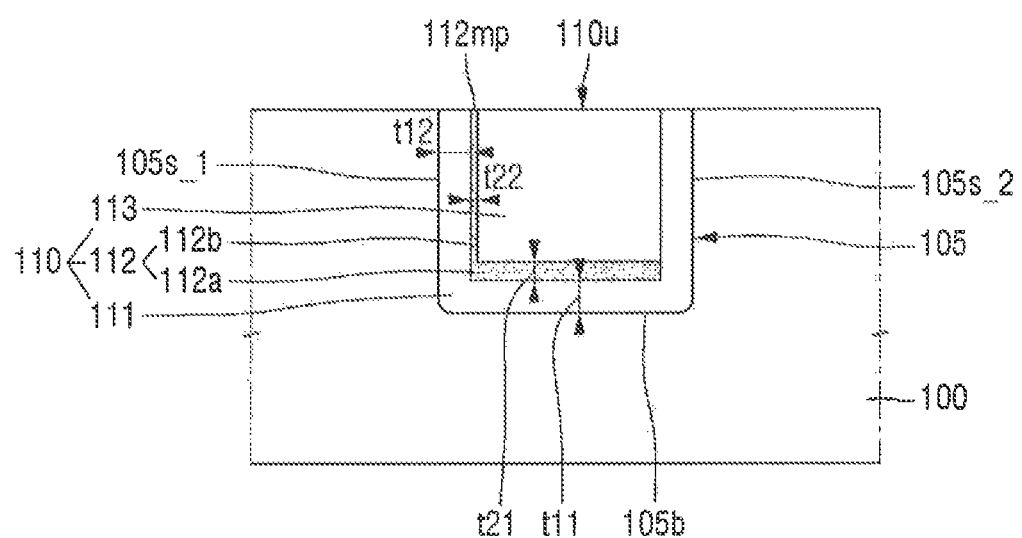
FIG. 4 is a view illustrating a semiconductor device according to some exemplary embodiments of the present invention.

FIG. 4 is a cross sectional view taken on line A-A of FIG. 1 illustrating a semiconductor device according to some exemplary embodiments of the present invention. For convenience of explanation, differences that are not explained above with reference to FIGS. 1 to 3 will be mainly explained below. It may therefore be assumed that elements not explained with respect to this figure are similar to or identical to corresponding elements described above with respect to corresponding elements.

Referring to FIG. 4, in the semiconductor device, according to some exemplary embodiments of the present invention, the insertion liner 112 may extend along the first sidewall 105s_1 of the first isolating trench and may also extend along the bottom surface 105b of the first isolating trench.

The insertion liner 112 might not include a portion extending along the second sidewall 105s_2 of the first isolating trench.

For example, the insertion liner 112 may include a portion extending along only one sidewall among the first and second opposing sidewalls 105s_1, 105_2 of the first isolating trench.

The insertion liner 112 may include a first portion 112a extending along the bottom surface 105b of the first isolating trench, and a second portion 112b extending along the first sidewall 105s_1 of the first isolating trench.

The second portion 112b of the insertion liner may extend to the upper surface 110u of the first device isolation film. Accordingly, a portion of the upper surface 110u of the first device isolation film may be an uppermost surface 112mp of the insertion liner, e.g., an uppermost surface of the second portion 112b of the insertion liner.

For example, the uppermost surface 112mp of the insertion liner may be exposed by the lower filling insulating film 111 and the upper filling insulating film 113. The uppermost surface 112mp of the insertion liner might not be disposed under the upper filling insulating film 113.

Because the second portion 112b of the insertion liner is formed along the first sidewall 105s_1 of the first isolating trench, the lower filling insulating film 111 on the first sidewall 105s_1 of the first isolating trench might not contact the upper filling insulating film 113.

Because the insertion liner 112 is not formed on the second sidewall 105s_2 of the first isolating trench, the lower filling insulating film 111 on the first sidewall 105s_1 of the first isolating trench may contact the upper filling insulating film 113.

A thickness t21 of the first portion 112a of the insertion liner may be different from a thickness t22 of the second portion 112b of the insertion liner.

In the semiconductor device, according to some exemplary embodiments of the present invention, a thickness t21, of the first portion 112a of the insertion liner may be greater than a thickness t22 of the second portion 112h of the insertion liner.

The thickness t22 of the second portion 112b of the insertion liner may be less than the thickness t12 of the lower filling insulating film 111 on the first sidewall 105s_1 of the first isolating trench.

Further, the thickness t22 of the second portion 112b of the insertion liner may be less than the thickness t11 of the lower filling insulating film 111 on the bottom surface 105b of the first isolating trench.

Referring to FIG. 4, the insertion liner 112 may include the second portion 112b of the insertion liner formed on the sidewall portion of the first device isolation film 110.

For example, the first device isolation film 110 may include a silicon nitride film formed on the sidewall portion of the first device isolation film 110.

In the semiconductor device, according to some exemplary embodiments of the present invention, the second portion 112b of the insertion liner formed on the sidewall portion of the first device isolation film 110 might not have sufficient thickness to trap electrons.

For example, the silicon nitride film may need to have a greater thickness than a critical thickness, e.g., 20 Å for the silicon nitride film to trap electrons. For example, when a thickness of the silicon nitride film is less than the critical thickness, the silicon nitride film might not have an electron-trapping property.

In the semiconductor device, according to some exemplary embodiments of the present invention, the thickness t22 of the second portion 112b of the insertion liner might not have sufficient thickness to trap electrons.

The first device isolation film 110 may include the silicon nitride film formed on the sidewall of the first device isolation film 110, and the first device isolation film 110 may be able to prevent the HEIP phenomenon from occurring.

Unlike the illustration in FIG. 4, the second portion 112b of the insertion liner may extend along a portion of the first sidewall 105s_1 of the first isolating trench. For example, the second portion 112b of the insertion liner might not extend to the upper surface 110u of the first device isolation film. Accordingly, the upper filling insulating film 113 may be disposed above the uppermost portion of the second portion 112b of the insertion liner.

Figure 5:
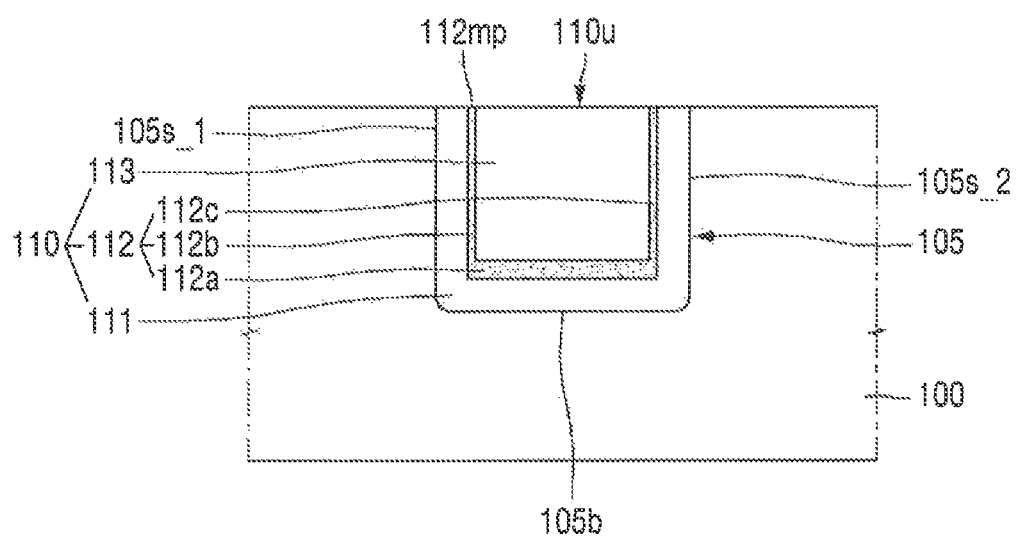
FIG. 5 is a view illustrating a semiconductor device according to some exemplary embodiments of the present invention.

FIG. 5 is a cross section view taken on line A-A of FIG. 1 illustrating a semiconductor device according to some exemplary embodiments of the present invention. Elements not explained with respect to this figure may be similar to or identical to corresponding elements described above with respect to corresponding elements of the prior figures.

Referring to FIG. 5, in the semiconductor device according to some exemplary embodiments of the present invention, the insertion liner 112 may extend along the first sidewall 105s_of the first isolating trench, the bottom surface 105b of the first isolating trench, and the second sidewall 105s_2 of the first isolating trench.

The insertion liner 112 may include the first portion 112a extending along the bottom surface 105b of the first isolating trench, the second portion 112b extending along the first sidewall 105s_1 of the first isolating trench, and a third portion 112c extending along the second sidewall 105s_2 of the first isolating trench.

The second portion 112b of the insertion liner and the third portion 112c of the insertion liner may respectively extend to the upper surface 110u of the first device isolation film. Accordingly, a portion of the upper surface 110u of the first device isolation film may be the uppermost surface 112mp of the insertion liner, e.g., the uppermost surface of the second portion 112b of the insertion liner and the uppermost surface of the third portion 112c of the insertion liner.

The uppermost surface 112mp of the insertion liner might not be disposed under the upper filling insulating film 113.

Because the second portion 112b of the insertion liner and the third portion 112c of the insertion liner may be respectively formed on the sidewalls 105s_1, 105s_2 of the first isolating trench, the lower filling insulating film 111 might not contact the upper filling insulating film 113.

For example, the filling insulating films 111, 113 including silicon oxide may be distinguished by the insertion liner 112 including silicon nitride.

A thickness of the first portion 112a of the insertion liner is greater than a thickness of the second portion 112b of the insertion liner and a thickness of the third portion 112c of the insertion liner.

Further, a thickness of the second portion 112b of the insertion liner is less than a thickness of the lower filling insulating film 111 on the first sidewall 105s_1 of the first isolating trench, and a thickness of the third portion 112c of the insertion liner is less than a thickness of the lower filling insulating film 111 on the second sidewall 105s_2 of the first isolating trench.

Unlike the illustration in FIG. 5, one of the second portion 112b of the insertion liner and the third portion 112c of the insertion liner may extend along a portion of the sidewalls 105s_1, 105s_2 of the first isolating trench. For example, one of the second portion 112b of the insertion liner and the third portion 112c of the insertion liner might not extend to the upper surface 110u of the first device isolation film.

Figure 6:
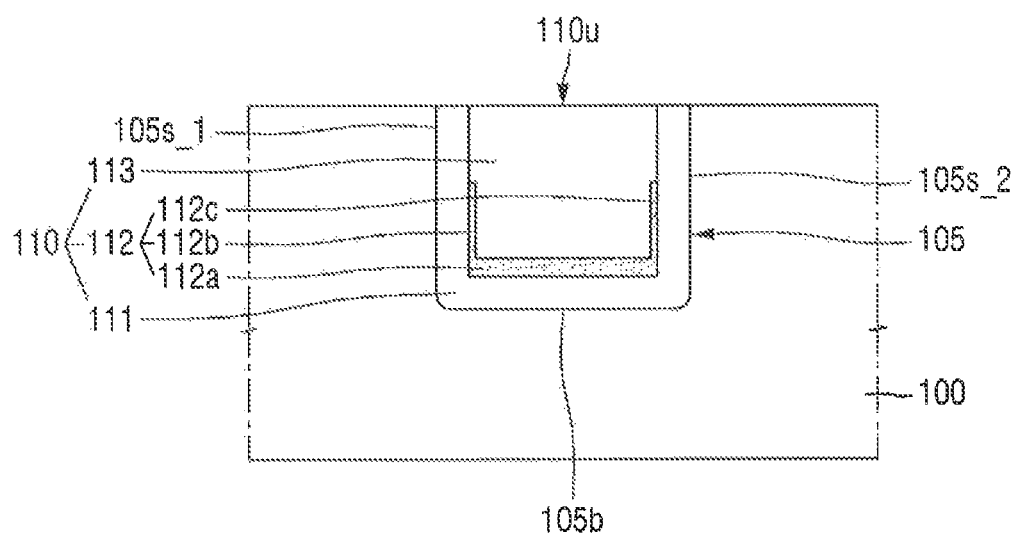
FIG. 6 is a view illustrating a semiconductor device according to some exemplary embodiments of the present invention.

FIG. 6 is a cross sectional view taken along line A-A of FIG. 1 illustrating a semiconductor device according to some exemplary embodiments of the present invention. Elements not explained with respect to this figure may be similar to or identical to corresponding elements described above with respect to corresponding elements of the prior figures.

Referring to FIG. 6, in the semiconductor device, according to some exemplary embodiments of the present invention, the insertion liner 112 within the filling insulating films 111, 113 may extend along the first sidewall 105s_1 of the first isolating trench, the bottom surface 105b of the first isolating trench, and the second sidewall 105s_2 of the first isolating trench.

The insertion liner 112 may include the first portion 112a extending along the bottom surface 105b of the first isolating trench, the second portion 112b extending along the first sidewall 105s_1 of the first isolating trench, and the third portion 112c extending along the second sidewall 105s_2 of the first isolating trench.

The second portion 112b of the insertion liner and the third portion 112c of the insertion liner might not respectively extend to the upper surface 110u of the first device isolation film. Accordingly, the upper filling insulating film 113 may be disposed above the uppermost portion of the second portion 112b of the insertion liner and the uppermost portion of the third portion 112c of the insertion liner.

For example, a height from the bottom surface 105b of the first isolating trench to the uppermost portion of the second portion 112b of the insertion liner may be less than a height from the bottom surface 105b of the first isolating trench to the uppermost portion of the upper filling insulating film 113, e.g., to the upper surface 110u of the first device isolation film.

Further, a height from the bottom surface 105b of the first isolating trench to the uppermost portion of the third portion 112c of the insertion liner may be less than a height to the upper surface 110u of the first device isolation film.

Accordingly, the upper surface 110u of the first device isolation film may be defined by the lower filling insulating film 111 and the upper filling insulating film 13.

Figure 7:
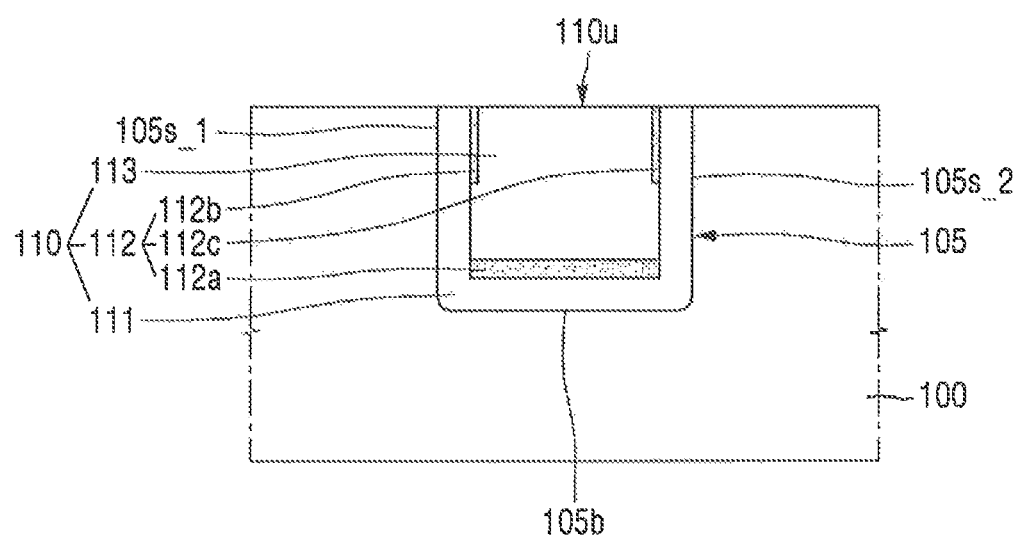
FIG. 7 is a view illustrating a semiconductor device according to some exemplary embodiments of the present invention.

FIG. 7 is a cross sectional view taken along line A-A of FIG. 1 illustrating a semiconductor device according to some exemplary embodiments of the present invention. Elements not explained with respect to this figure may be similar to or identical to corresponding elements described above with respect to corresponding elements of the prior figures.

Referring to FIG. 7, in the semiconductor device according to some exemplary embodiments of the present invention, the insertion liner 112 may include the first portion 112a extending along the bottom surface 105b of the first isolating trench, the second portion 112b extending along a portion of the first sidewall 105s_1 of the first isolating trench, and the third portion 112c extending along a portion of the second sidewall 105s_2 of the first isolating trench.

The first portion 112a of the insertion liner may be separated from the second portion 112b of the insertion liner and the third portion 112c of the insertion liner.

For example, the upper filling insulating film 113 may be interposed between the first portion 112a of the insertion liner and the second portion 112b of the insertion liner, and the upper filling insulating film 113 may be interposed between the first portion 112a of the insertion liner and the third portion 112c of the insertion liner.

The second portion 112b of the insertion liner and the third portion 112c of the insertion liner may be exposed by the lower filling insulating film 111 and the upper filling insulating film 113. For example, a portion of the upper surface 110u of the first device isolation film may be defined by the second portion 112b of the insertion liner and the third portion 112c of the insertion liner.

Unlike the illustration, at least one of the uppermost portion of the second portion 112b of the insertion liner and the uppermost portion of the third portion 112c of the insertion liner may be disposed below the upper filling insulating film 113.

Further, unlike the illustration, one of the second portion 112b of the insertion liner and the third portion 112c of the insertion liner may be connected with the first portion 112a of the insertion liner.

Additionally, unlike the illustration, the insertion liner 112 may include a first protrusion being connected with the first portion 112a of the insertion liner and extending along the first sidewall 105s_1 of the first isolating trench. The first protrusion might not be connected with the second portion 112b of the insertion liner.

Further, the insertion liner 112 may include a second protrusion being connected with the first portion 112a of the insertion liner and extending along the second sidewall 105s_2 of the first isolating trench. The second protrusion might not be connected with the third portion 112c of the insertion liner.

Figure 8:
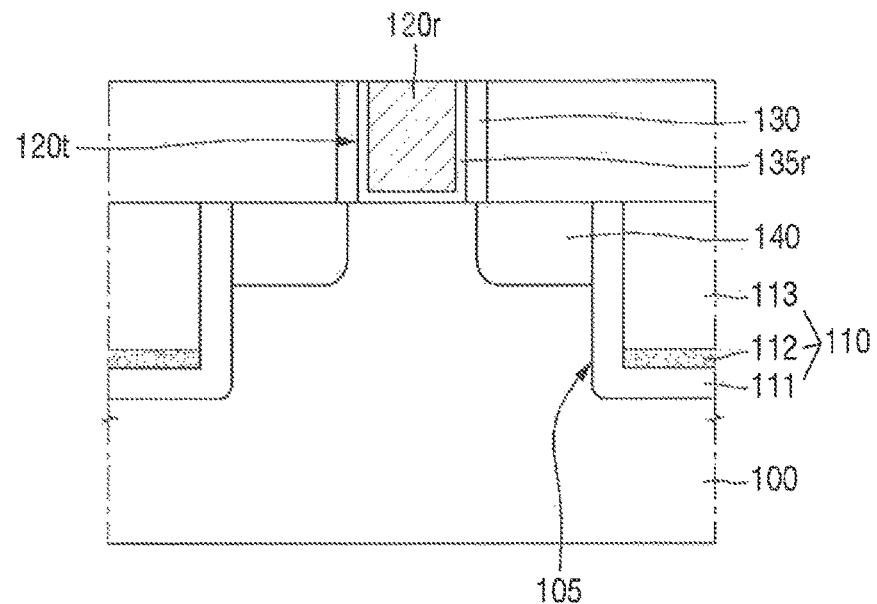
FIG. 8 is a view illustrating a semiconductor device according to some exemplary embodiments of the present invention.

FIG. 8 is a cross sectional view taken on line B-B of FIG. 1 illustrating a semiconductor device according to some exemplary embodiments of the present invention. Elements not explained with respect to this figure may be similar to or identical to corresponding elements described above with respect to corresponding elements of the prior figures.

Referring to FIG. 8, in the semiconductor device, according to some exemplary embodiments of the present invention, the gate spacer 130 may define a gate trench 120t on the substrate 100.

The gate insulating film 135r may extend along a sidewall and a bottom surface of the gate trench 120t. The gate insulating film 135r may include a portion extending along an inner sidewall of the gate spacer 130.

The gate electrode 120r may fill the gate trench 120t in which the gate insulating film 135r is formed. For example, the gate electrode 120r may be formed by a replacement process (or gate last process), but other approaches may be used to form the gate electrode 120r.

Figure 9:
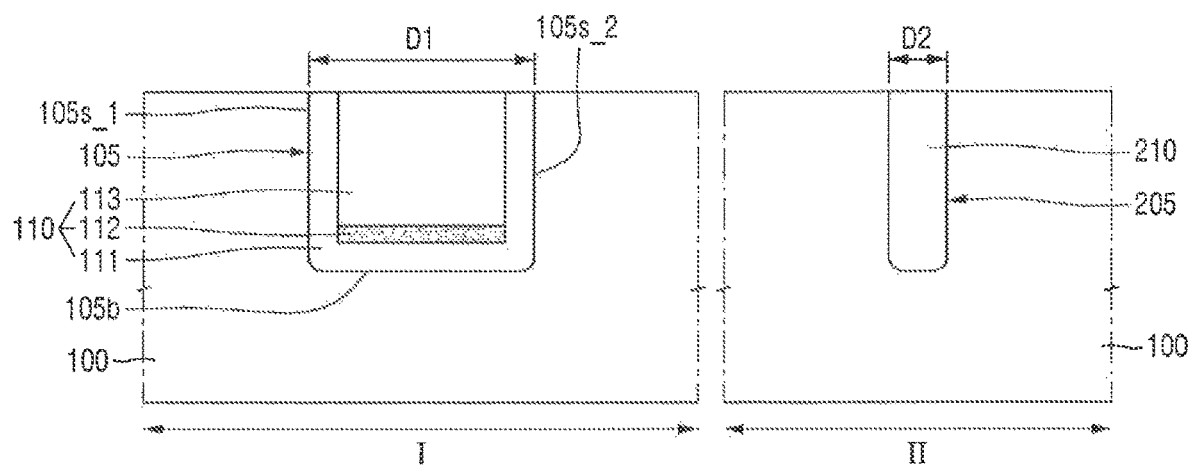
FIG. 9 is a view illustrating a semiconductor device according to some exemplary embodiments of the present invention.

FIG. 9 is a view illustrating a semiconductor device according to some exemplary embodiments of the present invention. Elements not explained with respect to this figure may be similar to or identical to corresponding elements described above with respect to corresponding elements of the prior figures.

Referring to FIG. 9, the semiconductor device, according to some exemplary embodiments of the present invention, may additionally include a second isolating trench 205 and a second device isolation film 210.

The substrate 100 may include the first region I and the second region II. The first region I and the second region II may be connected to each other or may be paced apart from each other.

The first region I and the second region II may perform different functions. For example, the second region II may be a cell region where a memory device is formed, and the first region I may be a peri-region formed on a periphery of the cell region, although the first I and second II regions may alternatively perform the same function.

The first isolating trench 105 and the first device isolation film 110 may be formed in the first region I of the substrate 100.

The first device isolation film 110 may include a lower filling insulating film 111, an insertion liner 112, and an upper filling insulating film 113.

The lower filling insulating film 111 may extend along the first sidewall 105s_1 of the first isolating trench, the bottom surface 105b of the first isolating trench, and the second sidewall 105s_2 of the first isolating trench.

The insertion liner 112 may be formed on the lower filling insulating film 111. The insertion liner 112 may be formed along the bottom surface 105b of the first isolating trench. The insertion liner 112 might not include a portion extending along the sidewalls 105s_1, 105s_2 of the first isolating trench. The insertion liner 112 might not extend along the sidewalls 105s_1, 105s_2 of the first isolating trench.

The upper filling insulating film 113 may be formed on the insertion liner 112 and the lower filling insulating film 111. The upper filling insulating film 113 may fill the first isolating trench 105.

A second isolating trench 205 may be formed within the substrate 100 of the second region II. For example, the first isolating trench 105 may be formed within the semiconductor layer included in the substrate 100.

Because the second isolating trench 205 may be formed within the semiconductor layer included in the substrate 100, the sidewall and the bottom surface of the second isolating trench may be defined by the semiconductor layer.

Although FIG. 9 illustrates a constant distance between the opposed sidewalls of the second isolating trench 205, exemplary embodiments of the present invention may have opposed sidewalls that do not run parallel to each other. A distance between the sidewalls facing each other of the second isolating trench 205 may increase or decrease as being farther away from the bottom surface of the second isolating trench 205.

The second device isolation film 210 may be formed within the substrate 100 of the second region II. The second device isolation film 210 may be formed by filling the second isolating trench 205. The second device isolation film 210 may include an insulating material.

The second device isolation film 210 may contact the semiconductor layer included in the substrate 100.

In the semiconductor device, according to some exemplary embodiments of the present invention, the second device isolation film 210 may be a single-layered film. For example, the second device isolation film 210 may be a film formed by using a single insulating material.

The second device isolation film 210 may include a material having etch selectivity with respect to the insertion liner 112. The second device isolation film 210 may include, for example, a silicon oxide-based material, such as a silicon oxide.

In the semiconductor device, according to some exemplary embodiments of the present invention, a width D1 of the first isolating trench 105 may be different from a width D2 of the second isolating trench 205. For example, the width D1 of the first isolating trench 105 may be greater than the width D2 of the second isolating trench 205.

The width D1 of the first isolating trench 105 and the width D2 of the second isolating trench 205 may be the widths at locations near the upper surface of the substrate 100.

Further, when a width of the first isolating trench 105 in one direction is different from a width in another direction different from the one direction of the first isolating trench, the width D1 of the first isolating trench 105 may be the smaller of the two widths.

The definition of the width of the second isolating trench 205 may be similar to the definition of the width of the first isolating trench 105 described above.

Figure 10:
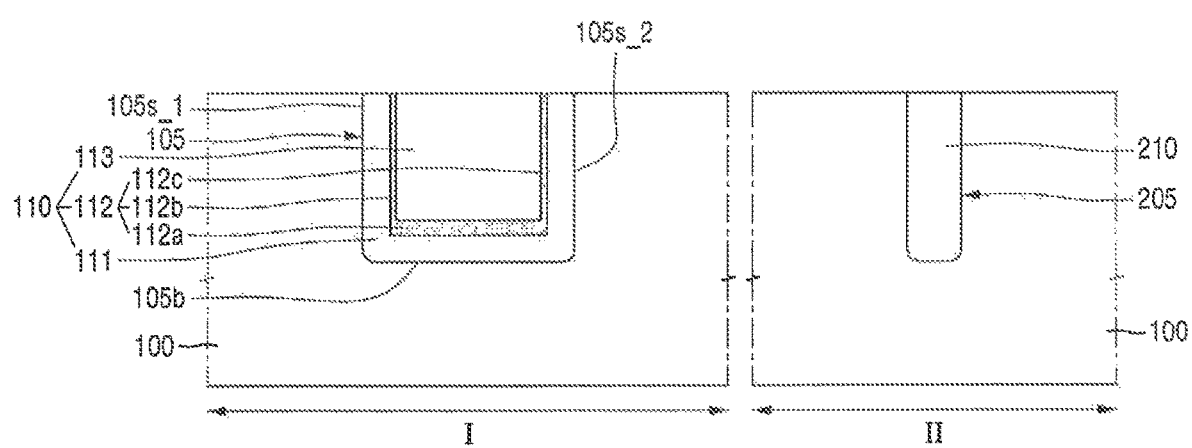
FIG. 10 is a view illustrating a semiconductor device according to some exemplary embodiments of the present invention.

FIG. 10 is a view illustrating a semiconductor device according to some exemplary embodiments of the present invention. Elements not explained with respect to this figure may be similar to or identical to corresponding elements described above with respect to corresponding elements of the prior figures.

Referring to FIG. 10, the insertion liner 112 may extend along the first sidewall 105s_1 of the first isolating trench, the bottom surface 105b of the first isolating trench, and the second sidewall 105s_2 of the first isolating trench.

The insertion liner 112 may include a first portion 112a extending along the bottom surface 105b of the first isolating trench, a second portion 112b extending along the first sidewall 105s_1 of the first isolating trench, and a third portion 112c extending along the second sidewall 105s_2 of the first isolating trench.

A thickness of the first portion 112a of the insertion liner may be greater than a thickness of the second portion 112b of the insertion liner and a thickness of the third portion 112c of the insertion liner.

Although the first region I of FIGS. 9 and 10 is illustrated similarly to the first region I of FIGS. 2 and 5 respectively, the first region I may be one of various exemplary embodiments explained with reference to FIGS. 2 and 4 to 7.

FIGS. 11 to 17 are views illustrating intermediate stages of fabrication, illustrating a method for fabricating a semiconductor device according to some exemplary embodiments of the present invention.

FIGS. 11 to 17 illustrate a process of fabricating a semiconductor device in different regions. However, FIGS. 11 to 17 separately illustrate the process of fabricating the semiconductor device in respective regions that are different from each other.

Figure 11:
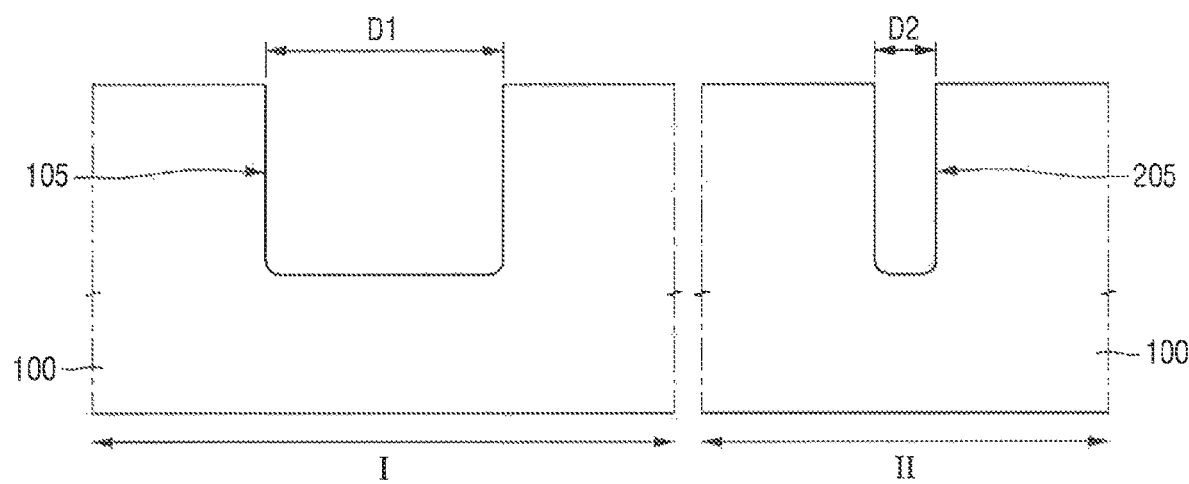
FIGS. 11 to 17 are views illustrating intermediate stages of fabrication in a method for fabricating a semiconductor device according to some exemplary embodiments of the present invention.

Referring to FIG. 11, the first isolating trench 105 and the second isolating trench 205 may be formed within the substrate 100. The first isolating trench 105 may be formed in the first region I, and the second isolating trench 205 may be formed in the second region II.

For example, the width D1 of the first isolating trench 105 may be greater than the width D2 of the second isolating trench 205.

FIG. 11 illustrates that the upper surface of the substrate 100 is exposed, however, the upper surface of the substrate 100 need not be exposed.

Figure 12:
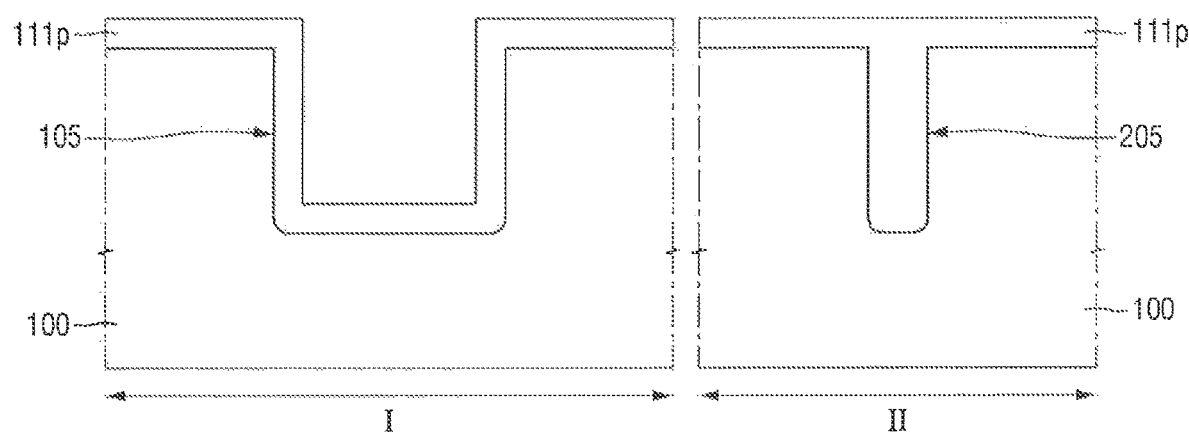

Referring to FIG. 12, a first insulating film 111p may be formed along the sidewall and the bottom surface of the first isolating trench 105, and along the upper surface of the substrate 100. Further, the first insulating film 111p may fill the second isolating trench 205.

Because the width of the second isolating trench 205 is less than the width of the first isolating trench 105, the first insulating film 111p may entirely fill the second isolating trench 205 when the first insulating film 111p is formed along the sidewall and the bottom surface of the first isolating trench 105.

The first isolating trench 105 might not be entirely filled by the first insulating film 111p.

The first insulating film 111p may be formed by using, for example, atomic layer deposition (ALD) or chemical vapor deposition (CVD).

The first insulating film 111p may include, for example, silicon oxide.

Figure 13:
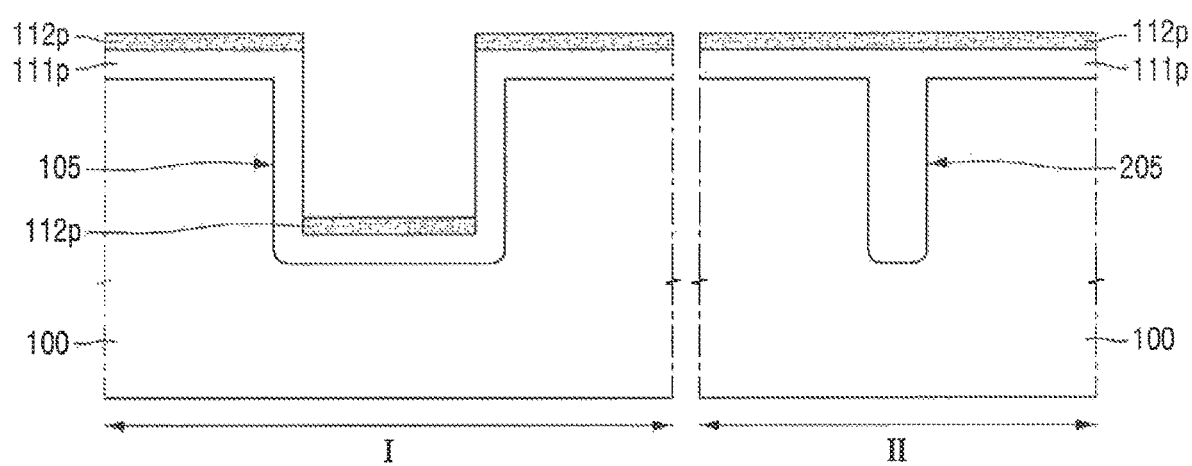

Referring to FIG. 13, a second insulating film 112p may be formed on the first insulating film 111p.

The second insulating film 112p may be formed along the upper surface of the substrate 100. Further, the second insulating film 112p may be formed along the bottom surface of the first isolating trench 105.

However, the second insulating film 112p might not be formed on the first insulating film 111p that is formed on the sidewall of the first isolating trench 105. For example, the second insulating film 112p might not be formed along the sidewall of the first isolating trench 105.

Because the first insulating film 111p may entirely fill the second isolating trench 205, the second insulating film 112p might not be formed within the second isolating trench 205. For example, the thickness of the second insulating film 112p formed within the second isolating trench 205 may have a negligible thickness.

The second insulating film 112p may be formed by using the anisotropic deposition, for example. The second insulating film 112p may include, for example, silicon nitride.

For example, in FIG. 13, the second insulating film 112p having a thickness greater than zero is formed on the upper surface of the substrate 100 and the bottom surface of the first isolating trench 105. The second insulating film 112p having a near-zero, or negligible thickness may be formed on the sidewall of the first isolating trench 105.

For example, a thickness of the second insulating film 112p formed on the upper surface of the substrate 100 and the bottom surface of the first isolating trench 105 may be greater than a thickness of the second insulating film 112p formed on the sidewall of the first isolating trench 105.

Figure 14:
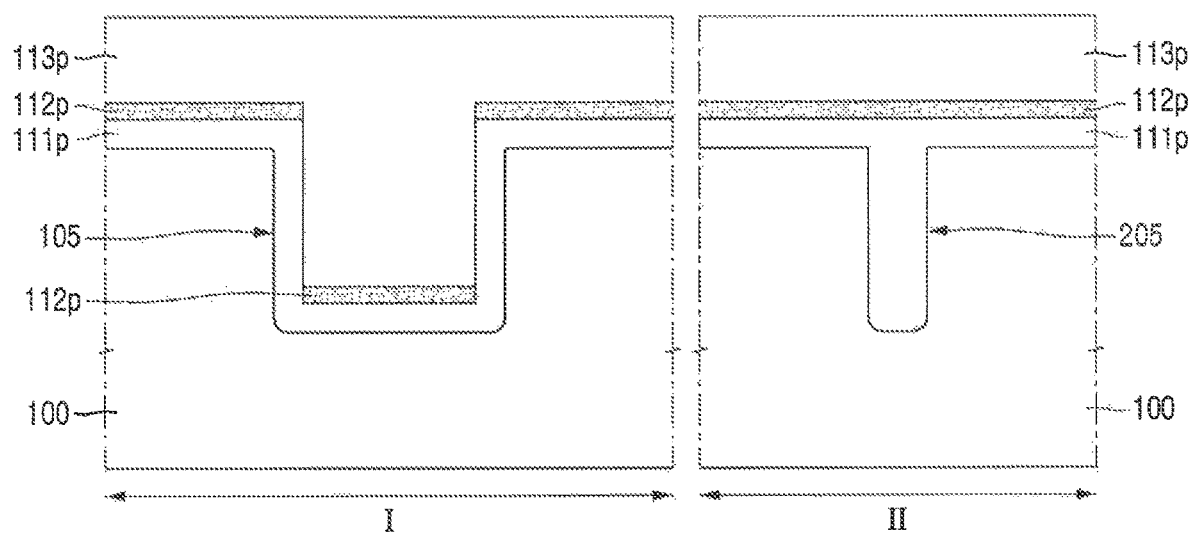

Referring to FIG. 14, a gap fill insulating film 113p may be formed on the second insulating film 112p. The gap fill insulating film 113p may fill the first isolating trench 105.

The gap fill insulating film 113p may be disposed above the second insulating film 112p on the upper surface of the substrate 100 in the first region I and the second region II.

Where needed, a post-treatment process may be performed on the gap fill insulating film 113p after the gap fill insulating film 113p is formed.

The gap fill insulating film 113p may be formed from an insulating material having excellent gap fill characteristic. For example, the gap fill insulating film 113p may include silicon oxide, flowable oxide (FOX), Tonen silazene (TOSZ), undoped silica glass (USG), borosilica glass (BSG), phosphosilica glass (PSG), borophosphosilica glass (BPSG), plasma enhanced tetra ethyl ortho silicate (PE-TEOS), fluoride silicate glass (FSG), carbon doped silicon oxide (CDO), organo silicate glass (OSG), and/or SiLK.

The gap fill insulating film 113p may include a material that changes into a silicon oxide-based insulating material (e.g., silicon oxide) through a post-treatment process that follows the deposition.

The gap fill insulating film 113p may include a material having an etch selectivity with respect to the second insulating film 112p.

The gap fill insulating film 113p may be formed by using, for example, CVD, low pressure CVD, plasma enhanced CVD (PECVD), physical vapor deposition (PVD), or spin coating.

For example, the gap fill insulating film 113p may be formed by using TOSZ. A TOSZ film may include a polysilazane film. The TOSZ film may be formed by using the spin coating method.

After the spin coating, densification process may be performed for the TOSZ film. For example, the TOSZ film may be densified by supplying O2 and H2O and then performing an annealing process. The TOSZ film densified as described above may include a silicon oxide film.

While the densification process of the TOSZ film is performed, the second insulating film 112p including silicon nitride may be partially consumed. For example, while the densification process is performed for the TOSZ film, a thickness of the second insulating film 112p may be reduced.

Figure 15:
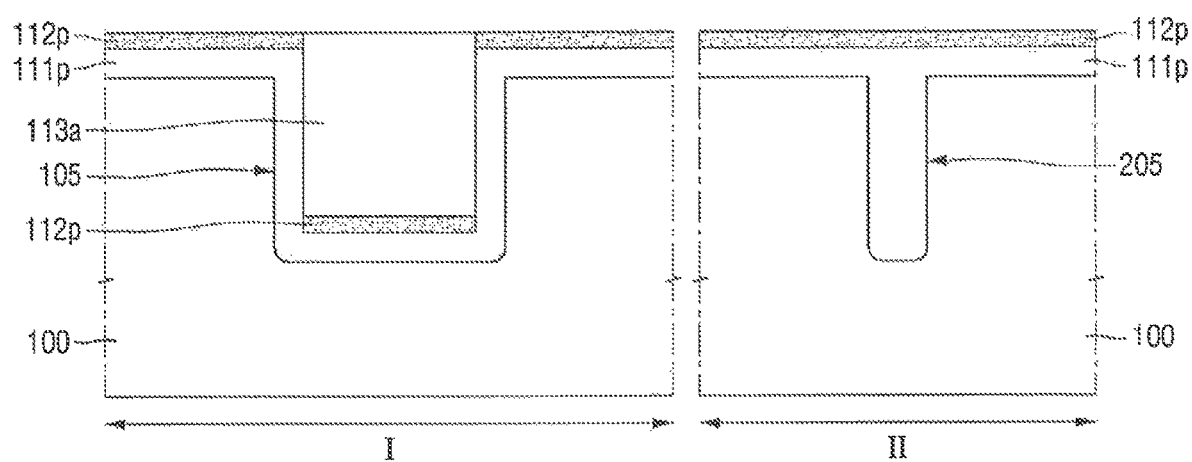

Referring to FIG. 15, the second insulating film 112p may be exposed upon planarizing of the gap fill insulating film 113p.

For example, the gap fill insulating film 113p may be removed after the second insulating film 112p is exposed.

Because the second insulating film 112p includes a material having an etch selectivity with respect to the gap fill insulating film 113p, the second insulating film 112p may play a role of an etch-stop film in the planarization process.

A pre-upper filling insulating film 113a filling the first isolating trench 105 may be formed by planarizing the gap fill insulating film 113p.

Figure 16:
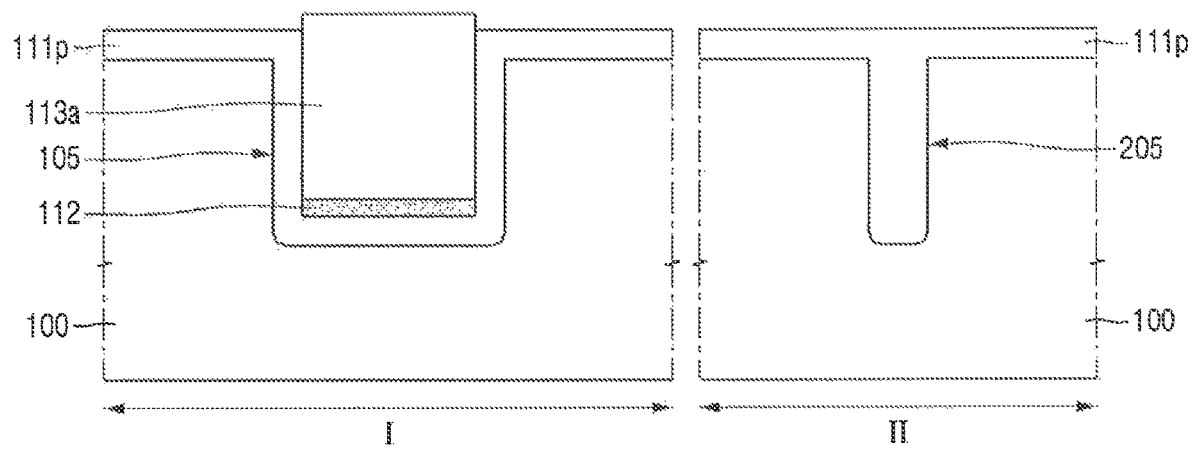

Referring to FIG. 16, the first insulating film 111p formed on the upper surface of the substrate 100 may be exposed by removing the exposed second insulating film 112p.

Because the second insulating film 112p includes etch selectivity with respect to the first insulating film 111p and the pre-upper filling insulating film 113a, the second insulating film 112p may be selectively removed.

The insertion liner 112 may be formed within the first isolating trench 105 upon removal of the second insulating film 112p on the upper surface of the substrate 100.

Figure 17:
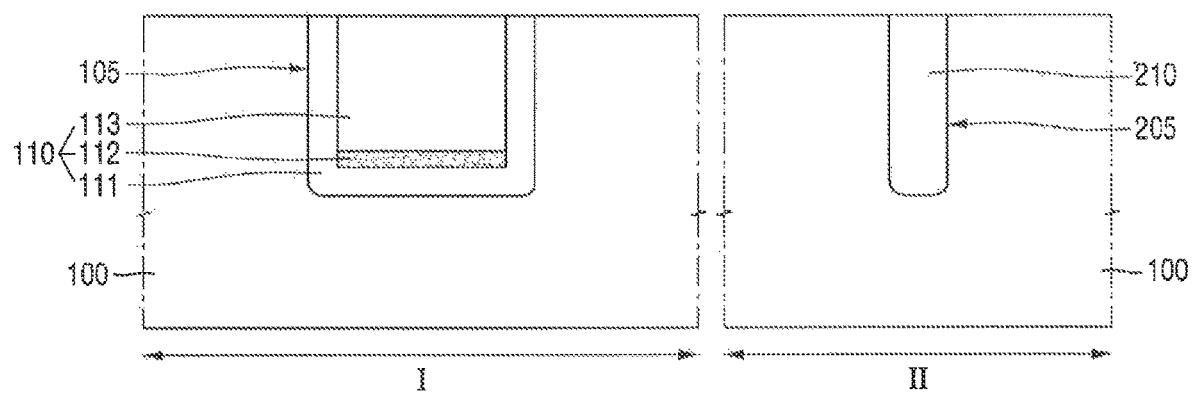

Referring to FIG. 17, the upper surface of the substrate 100 may be exposed by removing the first insulating film 111p on the upper surface of the substrate 100 and the pre-upper filling insulating film 113a protruding upward higher than the upper surface of the substrate 100.

As a result, the first device isolation film 110 filling the first isolating trench 105 and the second device isolation film 210 filling the second isolating trench 205 may be formed.

The first device isolation film 110 may include the lower filling insulating film 111 by the first insulating film 111p, the insertion liner 112 by the second insulating film 112p, and the upper filling insulating film 113 by the gap fill insulating film 113p.

Then, referring to FIG. 3, the gate electrode 120 may be formed on the exposed substrate 100.

Figure 18:
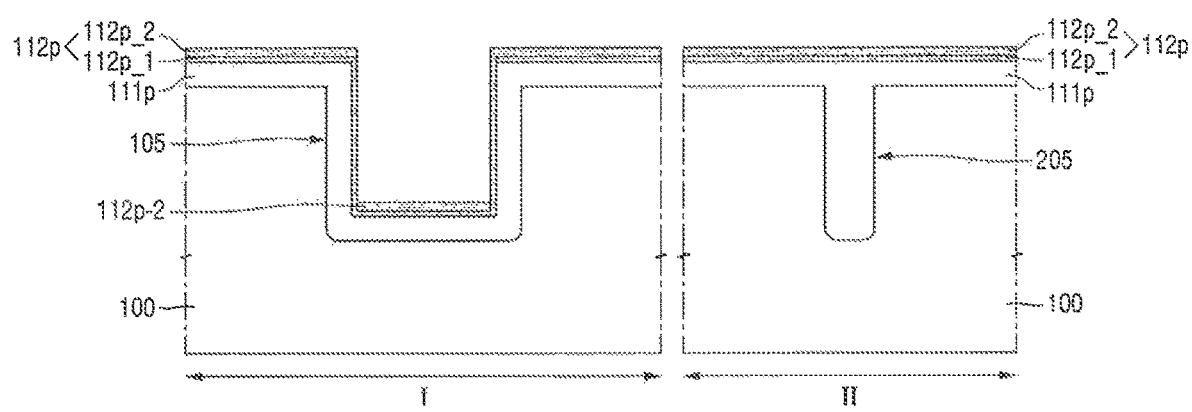
FIG. 18 is a view illustrating intermediate stage of fabrication in a method for fabricating a semiconductor device according to some exemplary embodiments of the present invention.

FIG. 18 is a view illustrating intermediate stage of fabrication in a method for fabricating a semiconductor device according to some exemplary embodiments of the present invention. Elements not explained with respect to this figure may be similar to or identical to corresponding elements described above with respect to corresponding elements of the prior figures.

For reference, FIG. 18 may be a process performed after FIG. 12.

Referring to FIG. 18, a second lower insulating film 112p_1 may be formed on the first insulating film 111p, and along the sidewall and the bottom surface of the first isolating trench 105 and the upper surface of the substrate 100.

The second lower insulating film 112p_1 may be formed conformally on the first insulating film 111p.

Then, a second upper insulating film 112p_2 may be formed on the second lower insulating film 112p_1.

The second upper insulating film 112p_2 may be formed along the bottom surface of the first isolating trench 105 and the upper surface of the substrate 100, but might not be formed on the sidewall of the first isolating trench 105.

The second lower insulating film 112p_1 and the second upper insulting film 112p_2 may include, for example, silicon nitride.

As a result, the second insulating film 112p including the second lower insulating film 112p_1 and the second upper insulating film 112p_2 may be formed on the first insulating film 111p.

The thickness of the second insulating film 112p on the upper surface of the substrate 100 and the thickness of the second insulating film 112p on the bottom surface of the first isolating trench 105 may each be greater than the thickness of the second insulating film 112p on the sidewall of the first isolating trench 105.

Then, as shown in FIG. 14, the gap fill insulating film 113p may be formed on the second insulating film 112p. While the gap fill insulating film 113p is formed, a thickness of the second insulating film 112p on the sidewall of the first isolating trench 105 may decrease.

In some cases, while the gap fill insulating film 113p is formed, nearly all or all of the second insulating film 112p on the sidewall of the first isolating trench 105 may be consumed.

Figure 19:
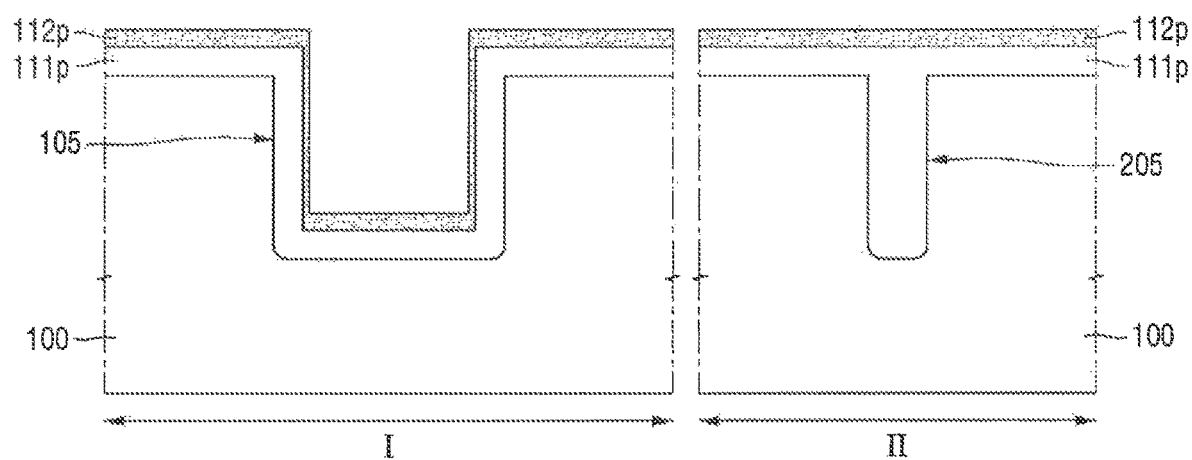
FIG. 19 is a view illustrating intermediate stage of fabrication in a method for fabricating a semiconductor device according to some exemplary embodiments of the present invention.

FIG. 19 is a view illustrating intermediate stage of fabrication, in a method for fabricating a semiconductor device according to some exemplary embodiments of the present invention. Elements not explained with respect to this figure may be similar to or identical to corresponding elements described above with respect to corresponding elements of the prior figures.

For reference, FIG. 19 may be a process performed after FIG. 12.

Referring to FIG. 19, the second insulating film 112p may be formed on the first insulating film 111p by using the anisotropic deposition.

Unlike the illustration in FIG. 13, the second insulating film 112p may be formed on the sidewall and the bottom surface of the first isolating trench 105 and the upper surface of the substrate 100 with the anisotropic deposition.

The second insulating film 112p may be formed non-conformally along the sidewall and the bottom surface of the first isolating trench 105, and the upper surface of the substrate 100.

For example, the thickness of the second insulating film 112p on the upper surface of the substrate 100 and the thickness of the second insulating film 112p on the bottom surface of the first isolating trench 105 may be greater than the thickness of the second insulating film 112p on the sidewall of the first isolating trench 105.

Then, in FIG. 14, the gap fill insulating film 113p may be formed on the second insulating film 112p.

Exemplary embodiments described herein are illustrative, and many variations can be introduced without departing from the spirit of the disclosure or from the scope of the appended claims. For example, elements and/or features of different exemplary embodiments may be combined with each other and/or substituted for each other within the scope of this disclosure and appended claims.

What is claimed is:

1. A semiconductor device, comprising;
a substrate comprising, a semiconductor layer;
a trench formed within the semiconductor layer;
a filling insulating film disposed within the trench; and
an insertion liner disposed within the filling insulating film, the insertion liner being spaced apart from the semiconductor layer and extending along the bottom surface of the trench,
wherein the insertion liner does not extend along a sidewall of the trench,
wherein the filling insulating film comprises a silicon oxide-based material and the insertion liner comprises a silicon nitride-based material,
wherein a thickness of the insertion liner is smaller than a thickness of a portion of the filling insulating film which is extended between the insertion liner and the substrate defining the bottom surface of the trench, and
wherein the filling insulating film entirely surrounds the insertion liner.

2. The semiconductor device of claim 1, wherein the insertion liner comprises a material having an etch selectivity with respect to the filling insulating film.

3. The semiconductor device of claim 1, further comprising:
an active region defined by the trench; and
a gate electrode formed across a portion of the filling insulating film and the active region.

4. A semiconductor device, comprising:
a substrate;
a trench formed within the substrate, the trench comprising a first sidewall and a second sidewall opposite to each other;
a first insulating film extending along the first sidewall, the second sidewall, and a bottom surface of the trench;
a second insulating film disposed on the first insulating film, the second insulating film extending along the bottom surface of the trench and, the first sidewall of the trench, wherein a thickness of the second insulating film on the bottom surface of the trench is greater than a thickness of the second insulating film on the first sidewall of the trench; and
a third insulating film disposed on the second insulating film, the third insulating film filling the trench,
wherein a thickness of the first insulating film on the bottom surface of the trench is greater than the thickness of the second insulating film on the bottom surface of the trench, and
wherein an uppermost portion of the second insulating film is exposed by the first insulating film and the third insulating film.

5. The semiconductor device of claim 4, wherein a thickness of the first insulating film on the first sidewall of the trench is greater than a thickness of the second insulating film on the first sidewall of the trench.

6. The semiconductor device of claim 4, wherein a thickness of the first insulating film on the bottom surface of the trench is greater than a thickness of the second insulating film on the first sidewall of the trench.

7. The semiconductor device of claim 4, wherein the second insulating film extends along the first sidewall, the bottom surface, and the second sidewall of the trench.

8. The semiconductor device of claim 4, wherein the first insulating film on the second sidewall. of the trench is in direct contact with the third insulating film.

9. The semiconductor device of claim 8, wherein the second insulating film does not extend along the second sidewall of the trench.

10. The semiconductor device of claim 4, wherein the third insulating film is in direct contact with the second insulating film.

11. The semiconductor device of claim 4, wherein the first insulating film and the third insulating file each comprise a silicon oxide-based material, and the second insulating film comprises a silicon nitride-based material.

12. A semiconductor device, comprising: a substrate;
a first trench formed within the substrate, the first trench having a first width;
a second trench formed within the substrate, the second trench having a second width different from the first width;
a first device isolation film comprising a first insulating film extending along a sidewall and a bottom surface of the first trench, a second insulating film disposed on the first insulating film and extending along the bottom surface of the first trench, and a third insulating film disposed on the second insulating film and filling the first trench, wherein the second insulating film comprises a material having an etch selectivity with respect to the first insulating film and the third insulating film; and
a second device isolation film filling the second trench and comprising a material having an etch selectivity with respect to the second insulating film,
wherein a thickness of the first insulating film on the bottom surface of the first trench is greater than a thickness of the second insulating film on the bottom surface of the first trench.

13. The semiconductor device of claim 12, wherein a width of the first trench is greater than a width of the second trench.

14. The semiconductor device of claim 12, wherein the first insulating film and the second device isolation film each comprise silicon oxide, and the second insulating film comprises silicon nitride.

15. A semiconductor device, comprising:
a substrate;
a first trench disposed in the substrate and having a first width:
a second trench disposed in the substrate and having a second width that is less than the first width;
a first device isolation film comprising a first insulating film that extends along a sidewall and a bottom surface of the first trench and includes silicon oxide, a second insulating film that is disposed on the first insulating film and extends along the sidewall and the bottom surface of the first trench and includes silicon nitride, and a third insulating film that is disposed on the second insulating film and fills the first trench and includes silicon oxide: and a second device isolation film filling the second trench and including silicon oxide, the second device isolation film being a single-layered film;

wherein a thickness of the first insulating film on the bottom surface -if the first trench is greater than a thickness of the second insulating film on the bottom surface of the first trench.

16. A semiconductor device, comprising:

a substrate including a cell region and a peripheral region;

a first trench disposed in the peripheral region and having a first width;

a second trench disposed in the cell region and having a second width that is less than the first width;

a first device isolation film comprising a first silicon oxide film extending along a sidewall and a bottom surface of the first trench, a silicon nitride liner film disposed on the first silicon oxide film and extending along the sidewall and the bottom surface of the first trench, and a second silicon oxide film disposed on the silicon nitride liner film and filling the first trench;

a second device isolation film filling the second trench and including silicon oxide;

a gate electrode disposed adjacent to the first trench and including poly-silicon, titanium nitride, tungsten nitride and tungsten; and a gate dielectric layer disposed between the gate electrode and the peripheral region of the substrate, and including silicon oxide and silicon oxynitride, wherein a thickness of the first silicon oxide film on the bottom surface of the first trench is greater than a thickness of the silicon nitride liner film on the bottom surface of the first trench and the second device isolation film does not include a silicon nitride liner film.

* * * * *